(12) United States Patent
Rutten

(10) Patent No.: US 6,747,469 B2
(45) Date of Patent: Jun. 8, 2004

(54) PRECONDITIONING INTEGRATED CIRCUIT FOR INTEGRATED CIRCUIT TESTING

(75) Inventor: Ivo Wilhelmus Johannes Marie Rutten, Saratoga, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 147 days.

(21) Appl. No.: 10/005,974

(22) Filed: Nov. 8, 2001

(65) Prior Publication Data

US 2003/0085726 A1 May 8, 2003

(51) Int. Cl.⁷ ............................................. G01R 31/26
(52) U.S. Cl. ...................................... 324/765
(58) Field of Search ........................................ 324/765

(56) References Cited

U.S. PATENT DOCUMENTS

| | | |
|---|---|---|
| 5,323,107 A | 6/1994 | D'Souza |
| 5,903,164 A | 5/1999 | Kline |
| 6,075,373 A | 6/2000 | Iino |
| 6,169,410 B1 | 1/2001 | Grace et al. |
| 6,486,693 B1 * | 11/2002 | Conner et al. .............. 324/765 |

FOREIGN PATENT DOCUMENTS

| | | |
|---|---|---|
| EP | 0 755 071 A2 | 7/1996 |
| WO | WO 96 17378 | 6/1996 |

OTHER PUBLICATIONS

IEEE 100 (The Authoritative Dictionary of IEEE Standards Terms), 7th Edition, Published by Standards Information Network IEEE Press, 2000, p. 570.*

Copending U.S. patent application Ser. No. 10/005,689, Rutten, filed Nov. 8, 2001, Rutten "Chip–Mounted Contact Springs".

"Introducing WOW Technology", http://www.formfactor.com/about/wow/wow_pg2.html.

"Introducing WOW Technology", http://www.formfactor.com/about/wow/wow_pg5.html.

"Focus on FormFactor", The Final Test Report, vol. 12, No. 09, Sep. 2001, Ikonix Corp. P.O. Box 1938, Lafayette, CA 94549–1938.

"Flip–Chip Bonding on 6–um Pitch using Thin–Film Microspring Technology", Donald L. Smith et al., Xerox Palo Alto Research Center, Proceedings, 48$^{th}$ Electronic Components and Technology Conference, IEEE, May 1998.

* cited by examiner

*Primary Examiner*—Evan Pert
(74) *Attorney, Agent, or Firm*—Michael J. Ure

(57) ABSTRACT

A test system is configured to include a preconditioning integrated circuit that is coupled between automatic test equipment (ATE) and a device-under-test (DUT). The preconditioning integrated circuit is configured to precondition signals that are communicated to and from the device-under-test, and particularly, to precondition high-frequency signals so as to avoid the adverse affects caused by long lead lines between the automated test equipment and the device-under-test. The preconditioning integrated circuit is designed to provide direct contact with the device-under-test, thereby providing very short lead lines to the device-under-test. High-frequency signals that are communicated to the device-under-test are generated, or reformed, at the preconditioning integrated circuit, based on control signals, or other test signals, from the automated test equipment. High-frequency, or time-critical, signals that are received from the device-under-test are processed and/or reformed by the preconditioning integrated circuit, for subsequent transmission to the automated test equipment.

16 Claims, 3 Drawing Sheets

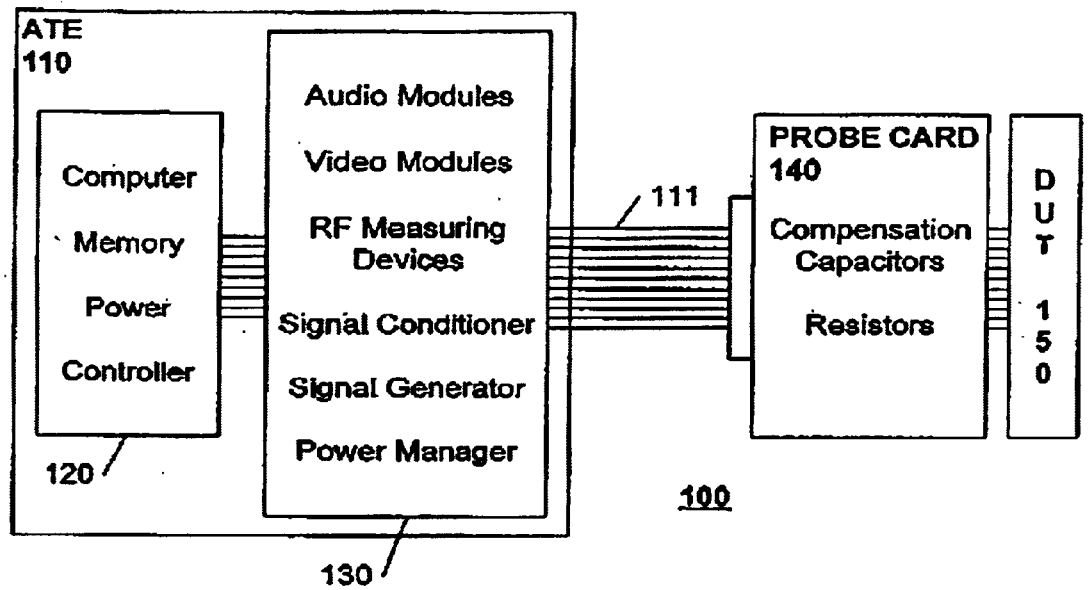
FIG. 1 [Prior Art]
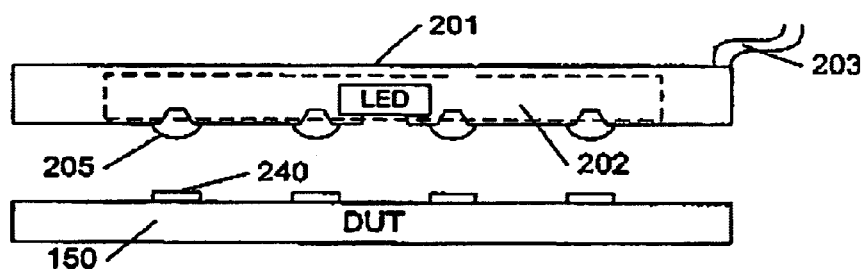
FIG. 2 [Prior Art]

PRECONDITIONING INTEGRATED CIRCUIT FOR INTEGRATED CIRCUIT TESTING

BACKGROUND OF THE INVENTION

1. Field of the Invention

This invention relates to the field of integrated circuit technology, and in particular to the testing of integrated circuits.

2. Description of Related Art

The testing of integrated circuits, particularly at high frequency, is becoming increasingly more complex, and therefore more costly. Test equipment must be continually upgraded and enhanced to include capabilities for testing devices that typically include the latest state-of-the-art technology.

FIG. 1 illustrates an example test system 100 comprising automated test equipment (ATE) 110 that is coupled to a device-under-test (DUT) 150 via a probe card 140. The ATE 110 typically includes a set of core test components 120, and special purpose test modules 130. In the example of FIG. 1, the system 100 is configured to enable testing of high-speed multimedia devices, using, for example, special purpose audio and video modules in the set of test modules 130. If the system 100 is used to test communications devices, the set of test modules 130 may contain, for example, discrete Fourier transform (DFT) modules, and other modules particular to communications devices. As the technologies used in the development of new devices 150 are advanced, the test modules 130 must be upgraded to keep pace with these advancements.

One of the particular problems associated with the testing of high-speed devices is the communication of signals to and from the device-under-test 150, particularly in the case of wafer-level testing. Long lead lines 111 from the test equipment 110 to the device-under-test 150 add capacitive and inductive loads to the driving signals. This additional load introduces a delay or mis-shaping of signals to and from the device-under-test 150. In many instances, certain tests cannot be performed 'at device speed', due to the distortions introduced by the long lead lines 111. Often, because the test system 100 is limited by the available test modules 130, the length of the leads 111, and other factors, tests are designed to correspond to the capabilities of the test system 100, rather than to the capabilities of the device-under-test 150. Additionally, because both the length and placement of the lines 111 affect the high-frequency characteristics of the lead lines 111, substantial time is often consumed to experiment with the mechanical setup. During testing, substantial time is often consumed in determining whether an observed anomalous behavior is caused by a problem in the device-under-test 150, or a problem in the test setup.

EP 0755071 teaches an alternative technique where the test system 100 is replaced by a special purpose integrated circuit that is configured to directly contact bonding pads on the device-under-test 150, as illustrated in FIG. 2. This special purpose integrated circuit 201 includes "solder-bump" contacts 205 that are configured to contact corresponding contact pads 240 on the device-under-test 150.

As taught in the referenced patent, the probe card 140 is configured to effect the testing of the device-under-test 150, using test circuitry 202 in the integrated circuit 201, thereby eliminating the need for the test equipment 110 of FIG. 1. In accordance with this referenced patent, the special purpose integrated circuit 201 receives power 203 from an external source to power the test circuitry 202, and includes a light emitting diode (LED) that indicates whether the device-under-test 150 is defective. Because the test circuitry 202 is designed to be a stand-alone device that is capable of determining whether or not the device-under-test 150 is defective, without reliance upon the automatic test equipment 110 of FIG. 1, the design of the test circuitry 202 can be expected to be a complex and time consuming process. Additionally, because the test circuitry 202 is designed to test a particular device 150, the design and fabrication costs for the integrated circuit 201 cannot be allocated among a variety of devices.

BRIEF SUMMARY OF THE INVENTION

It is an object of this invention to provide a test system that minimizes the adverse affects caused by long lead lines between automated test equipment and a device-under-test. It is a further object of this invention to provide a test architecture that facilitates the testing of a variety of devices. It is a further object of this invention to provide a preconditioning integrated circuit that is configurable for use in the testing of a variety of devices.

These objects and others are achieved by a test system that includes a preconditioning integrated circuit that is coupled between automatic test equipment (ATE) and a device-under-test (DUT). The preconditioning integrated circuit is configured to precondition signals that are communicated to and from the device-under-test, and particularly, to precondition high-frequency signals so as to avoid the adverse affects caused by long lead lines between the automated test equipment and the device-under-test. The preconditioning integrated circuit is designed to provide direct contact with the device-under-test, thereby providing very short lead lines to the device-under-test. High-frequency signals that are communicated to the device-under-test are generated, or reformed, at the preconditioning integrated circuit, based on control signals, or other test signals, from the automated test equipment. High-frequency, or time-critical, signals that are received from the device-under-test are processed and/or reformed by the preconditioning integrated circuit, for subsequent transmission to the automated test equipment.

BRIEF DESCRIPTION OF THE DRAWINGS

The invention is explained in further detail, and by way of example, with reference to the accompanying drawings wherein:

FIG. 1 illustrates an example block diagram of a prior art test system that includes automated test equipment.

FIG. 2 illustrates an example block diagram of a prior art test system that eliminates the need for automated test equipment.

DETAILED DESCRIPTION OF THE INVENTION

Figure 3:
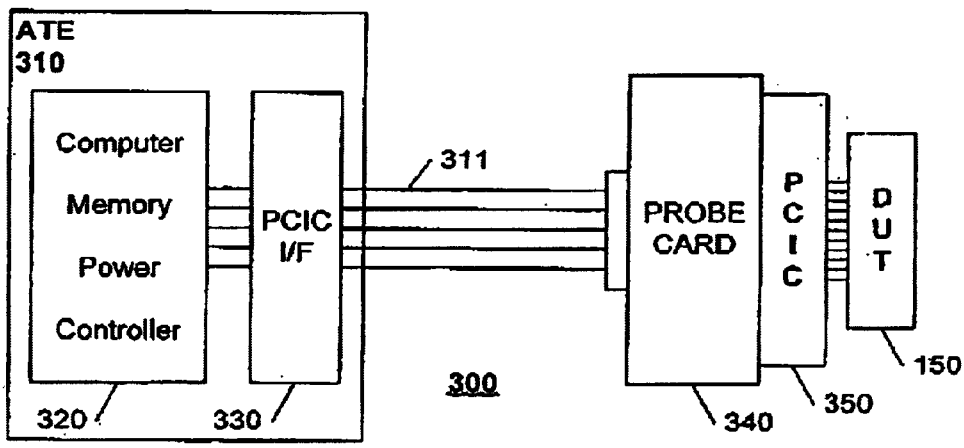
FIG. 3 illustrates an example block diagram of a test system that includes a preconditioning integrated circuit for preconditioning signals that are communicated between automated test equipment and a device-under-test in accordance with this invention.

FIG. 3 illustrates an example block diagram of a test system 300 that includes a preconditioning integrated circuit 350 for preconditioning signals that are communicated between automated test equipment 310 and a device-under-test 150 in accordance with this invention.

Consistent with conventional automated test equipment, the automated test equipment 310 includes a core system 320 that includes such items as a computer for generating a sequence of test operations, and a memory for storing a test program that controls the generation of the sequence of test operations, and for storing parameters related to the test operations, as well as the results obtained from the execution of the sequence of test operations. The core system 320 also preferably includes a power supply system that is configured to provide regulated voltage and currents to the device-under test 150, and other regulation and control systems as required.

The automated test equipment 310 also includes an interface 330 that is configured to facilitate the communication of signals to and from a preconditioning integrated circuit 350, via lead lines 311. These signals include test signals that are transmitted from the automated test equipment 310, and test responses that are received from the preconditioning integrated circuit 350. In a preferred embodiment, the preconditioning integrated circuit 350 is mounted on a probe card 340 that facilitates the mechanical and electrical connection of the circuit 350 to the equipment 310.

In accordance with this invention, the preconditioning integrated circuit 350 is configured to condition or process signals communicated to and from the device-under-test 150 so as to minimize signal distortions or other anomalies caused by long lead lines 311 between the automated test equipment 310 and the device-under-test 150. Additionally, or alternatively, the preconditioning integrated circuit 350 may be configured to provide complex input signals to the device-under-test 150, based on control test signals from the automated test equipment 310, or to provide a measurement result of a complex interdependency among input and output signals of the device-under-test, such as a measurement of a phase delay between an input stimuli and an output response, as discussed further below.

Figure 4:
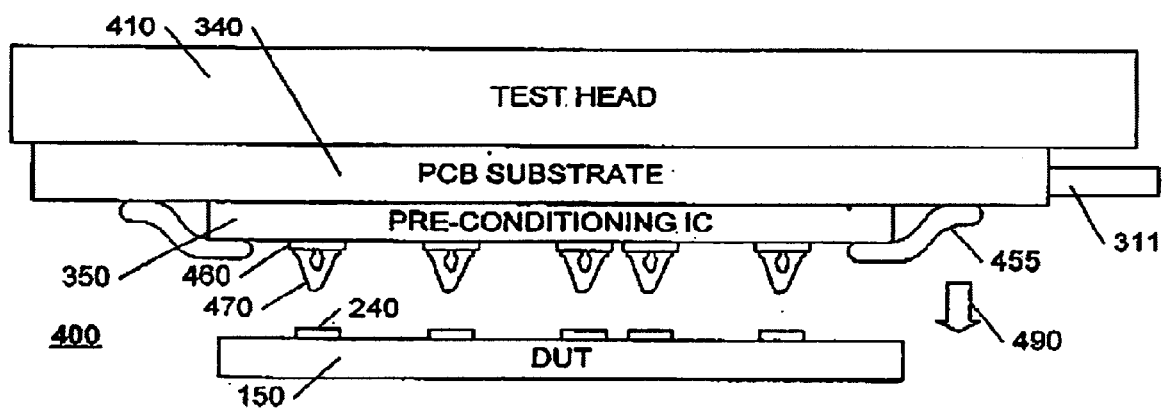
FIG. 4 illustrates an example arrangement of a test fixture that includes a preconditioning integrated circuit that provides direct contact to a device-under-test in accordance with this invention.

FIG. 4 illustrates an example arrangement of a test fixture 400 that includes a preconditioning integrated circuit 350 that provides direct contact to a device-under-test 150 in accordance with this invention. In a preferred embodiment, the text fixture 400 includes a test head 410, upon which is mounted a printed circuit board substrate that forms the probe board 340. The probe board 340 provides communication between the automated test equipment and the preconditioning integrated circuit, via conductors 311 and 455, respectively. The probe board 340 is illustrated in FIG. 4 as containing a single preconditioning integrated circuit 350, although it may containing multiple preconditioning integrated circuits 350 for simultaneously testing a plurality of devices-under-test 150, as well as other components that facilitate the testing of one or more devices-under-test 150.

In a preferred embodiment, the preconditioning integrated circuit 350 includes a plurality of contact points 470 that are configured to provide direct contact with corresponding contact points 240 on the device-under-test. Alternatively, the test contacts 470 may be located elsewhere on the probe board 340, and coupled to the preconditioning integrated circuit 350 as required. Because the preconditioning integrated circuit 350 is located on the test head 410, and the test head 410 is designed to provide direct contact with the device-under-test 150, adverse affects caused by the propagation of signals to and from a relatively remote automated test equipment 310 (of FIG. 3) via lead lines 311 can be minimized.

Any of a variety of techniques may be used to provide the contact points 470. Conventional techniques include the use of microsprings, as well as the solder bumps of the aforementioned EP 0755071. In a preferred embodiment, the contact points 470 are affixed to bonding pads 460 on the preconditioning integrated circuit 350, as discussed further below. Copending U.S. patent application "CHIP-MOUNTED CONTACT SPRINGS", Ser. No. 10/005,689, filed Nov. 8, 2001 for Ivo Rutten, teaches a contact technology that is particularly well suited for use in this invention, and is incorporated by reference herein. This copending application teaches the bonding of a segment of bonding wire to two adjacent points, forming a "V-shaped" contact point, the vertex of the "V" forming the contact point for contacting a corresponding contact 240 of the device-under-test 150, as illustrated in FIG. 4. The dual-bonded V-shaped contact 240 provides an inherently stable and resilient structure for repeated tests of devices 150, via a movement 490 of the test head 410 relative to each device-under-test 150.

Figure 5:
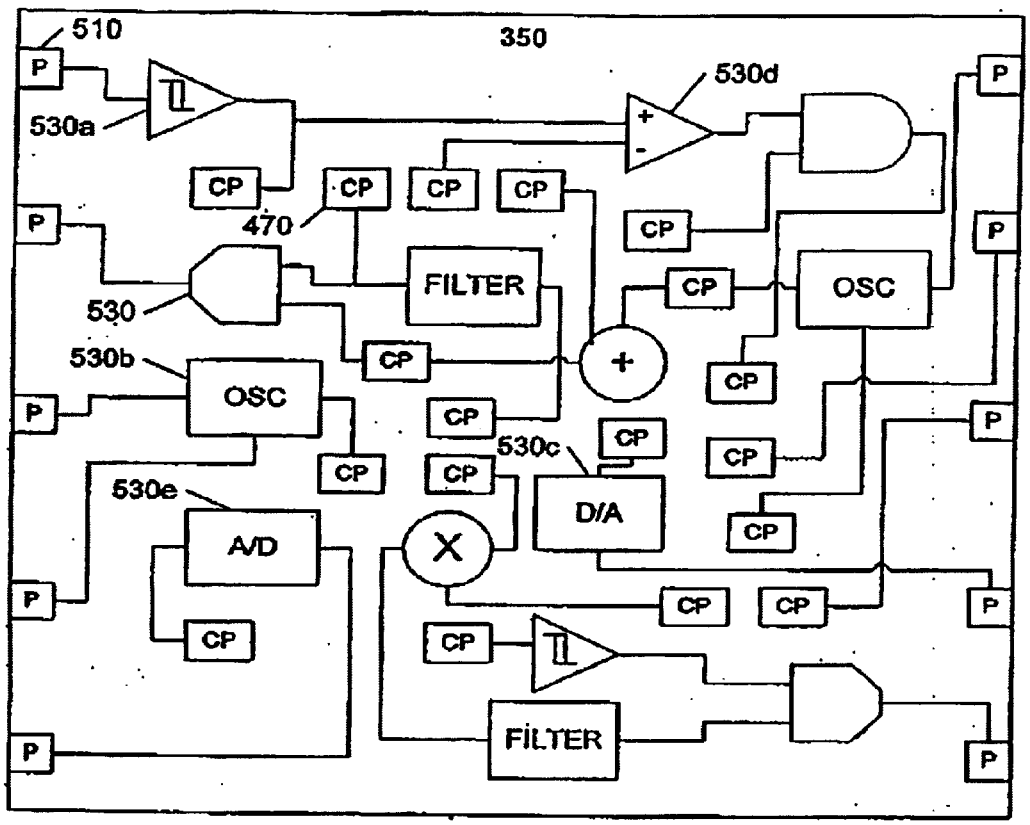
FIG. 5 illustrates an example block diagram of a preconditioning integrated circuit in accordance with this invention.

FIG. 5 illustrates an example block diagram of a preconditioning integrated circuit 350 in accordance with this invention. The example circuit 350 includes bonding pads P 510 for connecting the circuit 350 to the automated test equipment (310 in FIG. 3), typically via a probe card (340 in FIG. 3), and contact points CP 470 for connecting the circuit 350 to the device-under-test (150 in FIG. 3), as discussed above.

In accordance with this invention, the preconditioning integrated circuit 350 includes components 530 that facilitate a preconditioning of one or more signals that are communicated between the automated test equipment 310 and the device-under-test 150. For example, the transmission of a pulse signal via the lead lines 311 from the automated test equipment 310 may introduce a distortion of the transition edges, such as rounding, overshoots, undershoots, and so on. To eliminate this distortion before the pulse signal is applied to the device-under-test 150, a circuit 350 of this invention will include, for example, a Schmitt-trigger device 530a that reconstitutes the sharp edges of the pulse signal. In a like manner, if the desired test signal from the automated test equipment 310 is a series of periodic pulses, the circuit 350 of this invention may include an oscillator 530b to generate the periodic pulses locally, at the circuit 350, to provide sharp transitions to the device-under-test 150, under the control of the automated test equipment 310. That is, the automated test equipment 310 in this example will communicate a test signal that controls whether the oscillator 530b is enabled; because this test signal is substantially a DC-logic-level, it is virtually unaffected by the length of the lead lines 311. That is, the circuit 350 in this example converts a low-frequency test signal from the automated test equipment 310 into a higher-frequency oscillation signal that is applied to the device-under-test 150, without the adverse affects that would have been incurred if the higher-frequency oscillation signal had been transmitted via the lead lines 311. Other components 530 effect a transformation of test signals from the automated test equipment 310 to provide conditioned signals to the device-under-test 150, such as a digital-to-analog converter 530c that provides for the application of an analog signal to the device-under-test 150, via a digital test signal from the automated test equipment 310. Other means of conditioning, or transforming, test signals from the automated test equipment 310 into conditioned test signals that are applied to the device-under-test 150, to avoid the adverse effects of long lead lines 311, will be evident to one of ordinary skill in the art in view of this disclosure.

In addition to conditioning test signals from automated test equipment 310, the preconditioning integrated circuit 350 may also included components 350 that facilitate the transmission of response signals from the device-under-test 150 to the automated test equipment 310. In a simple example, some of the signals that are monitored during wafer level testing are not signals that are intended to be external to the packaged version of the device-under-test 150, and the load of the lead lines 311 may cause the circuitry in the device 150 to fail during testing, even though the particular device 150 may be perfectly functional.

For example, delays are often introduced to signals that are transmitted via the lead lines 311. These lead line delays often distort time-dependent measurements, such as a measurement of a phase difference between signals. To minimize the adverse effects of long lead lines 311 on the measurement of response signals from the device-under-test 150, the preconditioning circuit 350 may include, for example, a comparator 530d that compares an output from the device-under-test 150 to another signal, such as an input to the device-under-test 150, or an other output from the device-under-test 150. Similarly, an analog output from the device-under-test 150 may be transformed into a digital value that is transmitted to the automated test equipment 310, via an analog-to-digital converter 530e. Other means of conditioning, or transforming, response signals from the device-under-test 150 into test responses that are communicated to the automated test equipment 310 will be evident to one of ordinary skill in the art in view of this disclosure.

Components 530 may include, but are not limited to: filters, oscillators, mixers, amplifiers, analog-to-digital converters, digital-to-analog converters, voltage and current sources, attenuators, detectors, gain controls, signal conditioners, protection circuits, and so on. In like manner, for the processing of response signals from the device-under-test 150, the components 350 may be arranged to measure such parameters as: power, phase, noise, transients, undershoots, overshoots, and so on. Often, the processing of a test response signal may be 'distributed' among the preconditioning integrated circuit 350, the automated test equipment 310, and the device-under-test 150. That is, the device-under-test 150 may include a certain level of preconditioning, the preconditioning integrated circuit 350 another level, and the automated test equipment 310 a final level. A very high frequency signal, for example, may be modulated down to a lower frequency signal that is subsequently processed to determine noise content, phase characteristics, and other parameters. Providing such preconditioning at the preconditioning integrated circuit 350 removes the cost and complexity of the down-shifting modulator in each of the production devices-under-test 150, while also avoiding anomalies caused by long lead lines 311 to the test equipment 310.

Figure 6A:
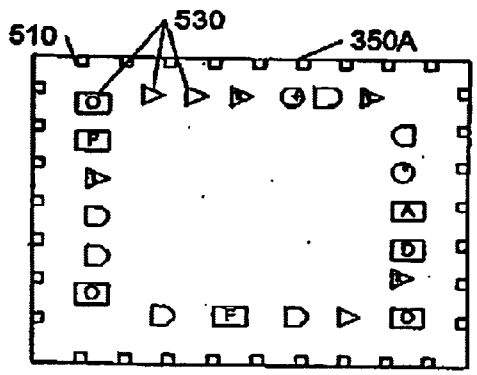
FIGS. 6A and 6B illustrate an example block diagram of a configurable preconditioning integrated circuit in accordance with this invention.
Figure 6B:
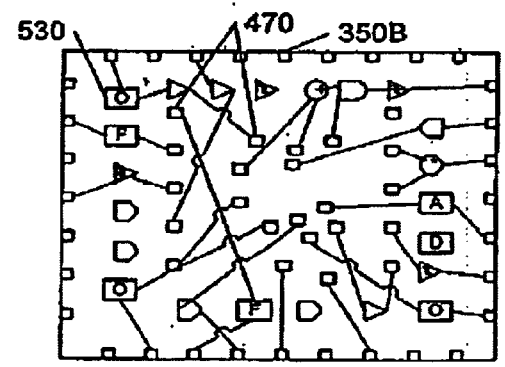

The example circuit of FIG. 5 corresponds to an example preconditioning integrated circuit 350 that is specifically designed for a particular device-under-test 150. Alternatively, FIGS. 6A and 6B illustrate an example block diagram of a configurable preconditioning integrated circuit 350A, 350B in accordance with this invention. The circuit 350A of FIG. 6A includes components 530 that are 'uncommitted', in that they are not yet configured to condition particular signals of a specific device-under-test. For example, the circuit 350A may correspond to an integrated circuit that is pre-fabricated with typical pre-processing components 530, without a final layer of metalization to connect the inputs or outputs of the components 530.

The circuit 350B of FIG. 6B illustrates a circuit 350A of FIG. 6A that has been customized for testing a particular device-under-test, by providing interconnections among the inputs and outputs of select components 530, bond pads 510, and contact points 470. Note that the center area of the circuit 350A of FIG. 6A is preferably designed to allow an unconstrained placement of contact points 470 on the circuit 350B, to correspond to the location of contact elements on the particular device-under-test. Select preconditioning components 530 are interconnected between these contact points 470 and the bonding pads 510 to effect the desired preconditioning of test and response signals that are communicated between the automated test equipment (310 of FIG. 3) and the device-under-test (150 of FIG. 3). This interconnection is preferably effected via a final metalization process applied to the circuit 350A. The contact points 470 of the circuit 350B of FIG. 6B are preferably formed by placing bond pads at appropriate locations corresponding to a mirror image of the contact elements of the particular device-under-test, and subsequently affixing bonding wire segments to these bond pads, as discussed above.

Note that not all of the available components 530 in the circuit 350A are utilized in the configured circuit 350B, resulting in an inefficiency compared to the specifically designed circuit 350 of FIG. 4. However, the circuit 350A may be used to form different versions of configured circuits 350B, for testing different devices-under-test, the design and fabrication costs associated with the circuit 350A can be distributed among the different devices-under-test. In a preferred embodiment, the circuit 350A is designed for a particular application technology, to optimize the likelihood of being able to configure the circuit 350A for a particular device-under-test in that application technology. That is, in preferred embodiments, the components 530 of a particular circuit 350A correspond to pre-processing components that are commonly used in a particular application technology, such as a set of components that are commonly used for preprocessing RF signals, or a set of components that are commonly used for preprocessing video signals, and so on.

The foregoing merely illustrates the principles of the invention. It will thus be appreciated that those skilled in the art will be able to devise various arrangements which, although not explicitly described or shown herein, embody the principles of the invention and are thus within its spirit and scope. For example, conventional automated test equipment typically includes capabilities for calibrating the test equipment as it is configured. One of ordinary skill in the art will recognize that the preconditioning circuit 350 may include additional circuitry to facilitate such calibration. For example, in the aforementioned example of providing a down-shifting modulator in the preprocessing integrated circuit 350, the preprocessing integrated circuit 350 may include a synthesizer to provide signals to characterize/calibrate the modulator, or circuitry to receive such signals from other devices on the probe board 340. In like manner, other devices on the probe board 340 may be configured to effect some or all of the preprocessing of select signals, via the preprocessing circuit 350. These and other system configuration and optimization features will be evident to one of ordinary skill in the art in view of this disclosure, and are included within the scope of the following claims.

I claim:

1. A test system comprising:
   automated test equipment that includes:
   a computer that is configured to execute a sequence of test operations for testing a device-under-test, and
   an interface circuit, operably coupled to the computer, that is configured to transmit test signals in dependence upon the sequence of test operations that are executed by the computer; and
   a preconditioning monolithic integrated circuit chip, operably coupled to the automated test equipment, that is configured to receive the test signals, and to generate therefrom at least one preconditioned test signal that is communicated to the device-under-test; wherein the preconditioning monolithic integrated circuit chip is immediately juxtaposed with the device-under-test, and includes at least one contact point that is arranged to provide direct contact to the device-under-test for communicating the at least one preconditioned test signal to the device-under-test; and
   a probe card, upon which the preconditioning integrated circuit is mounted, that facilitates coupling of the preconditioning integrated circuit to the automated test equipment, wherein the probe card is configured to provide for the mounting of a plurality of preconditioning integrated circuits, thereby facilitating simultaneous testing of a plurality of devices-under-test.

2. A test system comprising:
   automated test equipment that includes:
   a computer that is configured to execute a sequence of test operations for testing a device-under-test, and
   an interface circuit, operably coupled to the computer, that is configured to transmit test signals in dependence upon the sequence of test operations that are executed by the computer; and
   a preconditioning monolithic integrated circuit chip, operably coupled to the automated test equipment, that is configured to receive the test signals, and to generate therefrom at least one preconditioned test signal that is communicated to the device-under-test;
   wherein
   the preconditioning monolithic integrated circuit chip is immediately juxtaposed with the device-under-test, and includes at least one contact point that is arranged to provide direct contact to the device-under-test for communicating the at least one preconditioned test signal to the device-under-test; and
   the at least one contact point includes a bonding pad upon which a resilient structure is bonded to facilitate the direct contact to the device-under-test.

3. The test system of claim 2, wherein
   the resilient structure includes a bonding wire that is bonded to two substantially adjacent points on the preconditioning integrated circuit.

4. A test system comprising:
   automated test equipment that includes:
   a computer that is configured to execute a sequence of test operations for testing a device-under-test, and
   an interface circuit, operably coupled to the computer, that is configured to transmit test signals in dependence upon the sequence of test operations that are executed by the computer; and
   a preconditioning integrated circuit, operably coupled to the automated test equipment, that is configured to receive the test signals, and to generate therefrom at least one preconditioned test signal that is communicated to the device-under-test;
   wherein
   the preconditioning integrated circuit is located in immediate proximity to the device-under-test, and includes at least one contact point that is arranged to provide direct contact to the device-under-test for communicating the at least one preconditioned test signal to the device-under-test; and
   the preconditioning integrated circuit includes at least one of:
   a filter,
   an oscillator,
   a mixer,
   an amplifier,
   an analog-to-digital converter,
   a digital-to-analog converter,
   a voltage source,
   a current source,
   an attenuator,
   a detector,
   a gain control, and
   a signal conditioner.

5. A test system comprising:
   automated test equipment that includes:
   a computer that is configured to execute a sequence of test operations for testing a device-under-test, and
   an interface circuit, operably coupled to the computer, that is configured to transmit test signals in dependence upon the sequence of test operations that are executed by the computer; and
   a preconditioning integrated circuit, operable coupled to the automated test equipment, that is configured to receive the test signals, and to generate therefrom at least one preconditioned test signal that is communicated to the device-under-test;
   wherein
   the preconditioning integrated circuit is located in immediate proximity to the device-under-test, and includes at least one contact point that is arranged to provide direct contact to the device-under-test for communicating the at least one preconditioned test signal to the device-under-test; and
   the preconditioning integrated circuit is configured to measure at least one of:
   power,
   phase,
   noise,
   transients,
   undershoots, and
   overshoots.

6. A test system comprising:
   automated test equipment that includes:
   a computer that is configured to execute a sequence of test operations for testing a device-under-test, and
   an interface circuit, operably coupled to the computer, that is configured to transmit test signals in dependence upon the sequence of test operations that are executed by the computer; and
   a preconditioning integrated circuit, operably coupled to the automated test equipment, that is configured to receive the test signals, and to generate therefrom at least one preconditioned test signal that is communicated to the device-under-test;
   wherein the preconditioning integrated circuit is located in immediate proximity to the device-under-test, and includes at least one contact point that is arranged to provide direct contact to the device-under-test for communicating the at least one preconditioned test signal to the device-under-test; and the preconditioning integrated circuit includes calibration circuitry that facilitates a calibration of the preconditioning integrated circuit by the automated test equipment.

7. A test system comprising:

automated test equipment that includes:
- a computer that is configured to execute a sequence of test operations for testing a device-under-test, and
- an interface circuit, operably counted to the computer, that is configured to transmit test signals in dependence upon the sequence of test operations that are executed by the computer; and a preconditioning integrated circuit, operably coupled to the automated test equipment, that is configured to receive the test signals, and to generate therefrom at least one preconditioned test signal that is communicated to the device-under-test;

wherein
- the preconditioning integrated circuit is located in immediate proximity to the device-under-test, and includes at least one contact point that is arranged to provide direct contact to the device-under-test for communicating the at least one preconditioned test signal to the device-under-test;
- the preconditioned test signal is a high-frequency signal; and
- the preconditioning integrated circuit is configured to provide this high-frequency preconditioned test signal bused on a low-frequency test signal of the test signals that are transmitted from the interface circuit.

8. A preconditioning monolithic integrated circuit chip comprising:

a plurality of conditioning elements,
each conditioning element includes circuitry that facilitates a conditioning of a test signal that is communicated from an automated test equipment, to form a conditioned test signal that is communicated to a device-under-test, and wherein
the preconditioning monolithic integrated circuit chin is configured to be immediately juxtaposed with the device-under-test when the conditioned test signal is communicated to the device-under-test; wherein
the plurality of conditioning elements are located within the preconditioning integrated circuit independent of the device-under-test.

9. A preconditioning monolithic integrated circuit chip comprising:

a plurality of conditioning elements,
each conditioning element includes circuitry that facilitates a conditioning of a test signal that is communicated from an automated test equipment to form a conditioned test signal that is communicated to a device-under-test, and wherein
the preconditioning monolithic integrated circuit chip is configured to be immediately juxtaposed with the device-under-test when the conditioned test signal is communicated to the device-under-test; further including contact points that are configured to provide direct contact to the device-under-test for effecting communication between the preconditioning monolithic integrated circuit chip and the device-under-test, wherein the preconditioning monolithic integrated circuit chip comprises:
a lower set of layers that include the plurality of conditioning elements, and
an upper set of layers that include the contact points; and
the lower set of layers is formed independent of the device-under-test.

10. The preconditioning integrated circuit of claim 9, wherein the contact points are:
placed on the integrated circuit during a final fabrication stage to conform to a mirror image of contact elements on the device-under-test, and
connected to select conditioning elements during the final fabrication stage.

11. The preconditioning integrated circuit of claim 10, wherein each of the contact points includes a bonding pad upon which a resilient structure is bonded to facilitate a direct contact to the device-under-test.

12. The preconditioning integrated circuit of claim 11, wherein the resilient structure includes a bonding wire that is bonded to two substantially adjacent points on the preconditioning integrated circuit.

13. A method of testing, comprising:

programming an automated test equipment to execute a sequence of test operations for testing a device-under-test via a transmission of test signals to a preconditioning monolithic integrated circuit chip, and providing the preconditioning monolithic integrated circuit chip that is configured to receive the test signals, and to generate therefrom at least one preconditioned test signal that is communicated to the device-under-test via a connection to the device-under-test with the preconditioning monolithic integrated circuit chip being immediately juxtaposed with the device-under-test.

14. A method of testing, comprising:

programming an automated test equipment to execute a sequence of test operations for testing a device-under-test via a transmission of test signals to a preconditioning monolithic integrated circuit chip, and providing the preconditioning monolithic integrated circuit chip that is configured to receive the test signals, and to generate therefrom at least one preconditioned test signal that is communicated to the device-under-test via a connection to the device-under-test with the preconditioning monolithic integrated circuit chip being immediately juxtaposed with the device-under-test; further including providing a configurable integrated circuit that includes a plurality of conditioning elements, each conditioning element including circuitry that facilitates a conditioning of an input signal to form a conditioned test signal, and configuring the configurable integrated circuit to produce the preconditioned monolithic integrated circuit chip via a connection of at least one of the test signals as the input signal of at least one conditioning element of the plurality of conditioning elements, such that the conditioned test signal of the at least one conditioning element forms the preconditioned test signal that is communicated to the device-under-test.

15. A method of testing, comprising:

programming an automated test equipment to execute a sequence of test operations for testing a device-under-test via a transmission of test signals to a preconditioning monolithic integrated circuit chip, and providing the preconditioning monolithic integrated circuit chip that is configured to receive the test signals, and to generate therefrom at least one preconditioned test signal that is communicated to the device-under-test via a connection to the device-under-test with the preconditioning monolithic integrated circuit chip being immediately juxtaposed with the device-under-test; wherein providing the preconditioning monolithic integrated circuit chip includes providing a probe card that includes a plurality of preconditioning monolithic integrated circuit chips, thereby facilitating simultaneous testing of a plurality of devices-under-test.

16. A method of testing, comprising:

programming an automated test equipment to execute a sequence of test operations for testing a device-under-test via a transmission of test signals to a preconditioning monolithic integrated circuit chip, and providing the preconditioning monolithic integrated circuit chip that is configured to receive the test signals, and to generate therefrom at least one preconditioned test signal that is communicated to the device-under-test via a connection to the device-under-test with the preconditioning monolithic integrated circuit chip being immediately juxtaposed with the device-under-test; wherein the preconditioning monolithic integrated circuit chip is configured to measure at least one of:

power,
phase,
noise,
transients,
undershoots, and
overshoots.

* * * * *